(12) United States Patent
Kwon

(10) Patent No.: US 12,232,356 B2
(45) Date of Patent: Feb. 18, 2025

(54) STRETCHABLE DISPLAY DEVICE

(71) Applicant: SAMSUNG DISPLAY CO., LTD., Yongin-si (KR)

(72) Inventor: Oh June Kwon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/951,637

(22) Filed: Sep. 23, 2022

(65) Prior Publication Data

US 2023/0018408 A1    Jan. 19, 2023

Related U.S. Application Data

(63) Continuation of application No. 15/848,281, filed on Dec. 20, 2017, now Pat. No. 11,469,401, which is a continuation of application No. 14/811,233, filed on Jul. 28, 2015, now Pat. No. 9,853,246.

(30) Foreign Application Priority Data

Jan. 15, 2015 (KR) .......... 10-2015-0007618

(51) Int. Cl.
| | |
|---|---|
| *H10K 50/822* | (2023.01) |
| *H10K 50/844* | (2023.01) |
| *H10K 59/131* | (2023.01) |
| *H10K 77/10* | (2023.01) |
| *H10K 59/122* | (2023.01) |
| *H10K 102/00* | (2023.01) |

(52) U.S. Cl.
CPC ....... *H10K 50/8445* (2023.02); *H10K 50/822* (2023.02); *H10K 50/844* (2023.02); *H10K 59/131* (2023.02); *H10K 77/111* (2023.02); *H10K 59/122* (2023.02); *H10K 2102/311* (2023.02); *Y02E 10/549* (2013.01)

(58) Field of Classification Search
CPC ............. H10K 50/8445; H10K 59/131; H10K 77/111; H10K 50/822; H10K 50/844
See application file for complete search history.

(56) References Cited

U.S. PATENT DOCUMENTS

| | | | |
|---|---|---|---|
| 8,569,951 | B2 | 10/2013 | Ryu et al. |
| 2001/0052752 | A1 | 12/2001 | Ghosh et al. |
| 2008/0284331 | A1 | 11/2008 | Hayashi |
| 2013/0153915 | A1 | 6/2013 | Choi et al. |

(Continued)

FOREIGN PATENT DOCUMENTS

| | | |
|---|---|---|
| JP | 2004-31101 | 1/2004 |
| JP | 2008-242249 | 10/2008 |

(Continued)

*Primary Examiner* — Trang Q Tran
(74) *Attorney, Agent, or Firm* — KILE PARK REED & HOUTTEMAN PLLC

(57) ABSTRACT

A stretchable display device includes a stretchable substrate, at least a portion of which is stretchable in at least one direction, a plurality of light emitting units formed on the stretchable substrate, the light emitting units being spaced apart from each other, the light emitting units each including a pixel electrode, an emission layer, a common electrode, and a common wiring electrode conducted to the common electrode, and a plurality of encapsulations covering and protecting the plurality of light emitting units, respectively.

19 Claims, 11 Drawing Sheets

(56) References Cited

U.S. PATENT DOCUMENTS

| | | |
|---|---|---|
| 2013/0161680 A1 | 6/2013 | Oh et al. |
| 2014/0048828 A1 | 2/2014 | Yang et al. |
| 2014/0091337 A1 | 4/2014 | Ooyabu et al. |
| 2014/0117342 A1 | 5/2014 | Kwon et al. |
| 2014/0166999 A1* | 6/2014 | Kim ................... H10K 59/124 438/23 |
| 2015/0048361 A1 | 2/2015 | Yamakita et al. |
| 2015/0048402 A1 | 2/2015 | Urano et al. |
| 2015/0263256 A1 | 9/2015 | Hsieh et al. |
| 2015/0344298 A1 | 12/2015 | Shimooka et al. |

FOREIGN PATENT DOCUMENTS

| | | |
|---|---|---|
| JP | 2009-48851 | 3/2009 |
| JP | 2014-39035 | 2/2014 |
| KR | 10-0718102 | 5/2007 |
| KR | 10-2009-0068505 | 6/2009 |
| KR | 10-2009-0086199 | 8/2009 |
| KR | 10-0955390 | 4/2010 |
| KR | 10-2012-0040549 | 4/2012 |
| KR | 10-1298159 | 8/2013 |
| KR | 10-1441235 | 9/2014 |

* cited by examiner

STRETCHABLE DISPLAY DEVICE

CROSS-REFERENCE TO RELATED APPLICATIONS

This is a continuation application based on currently U.S. patent application Ser. No. 15/848,281, filed on Dec. 20, 2017 (now U.S. Pat. No. 11,469,401), the disclosure of which is incorporated herein by reference in its entirety. U.S. patent application Ser. No. 15/848,281 is a continuation application of U.S. patent application Ser. No. 14/811,233, filed Jul. 28, 2015, now U.S. Pat. No. 9,853,246, issued Dec. 26, 2017, claims priority benefit of Korean Patent Application No. 10-2015-0007618, filed on Jan. 15, 2015, in the Korean Intellectual Property Office, and entitled: "Stretchable Display Device," is incorporated by reference herein in its entirety.

BACKGROUND

1. Field

Embodiments relate to a stretchable display device, and more particularly, to a stretchable display device which may be stretched in at least one direction.

2. Description of the Related Art

Display devices which may be changed in use include those folding a screen in half and those rolled in a roll form. The changeable display device may meet a demand to make a screen large while the display device is used and a demand to make the screen down-size when the display device is carried.

The above information disclosed in this Background section is only for enhancement of understanding of the background of the disclosure and therefore it may contain information that does not form the prior art that is already known in this country to a person of ordinary skill in the art.

SUMMARY

Embodiments are directed to a stretchable display device, including a stretchable substrate, at least a portion of which is stretchable in at least one direction, a plurality of light emitting units formed on the stretchable substrate, the light emitting units being spaced apart from each other, the light emitting units each including a pixel electrode, an emission layer, a common electrode, and a common wiring electrode conducted to the common electrode, and a plurality of encapsulations covering and protecting the plurality of light emitting units, respectively.

The stretchable display device may further include a stretchable electrode formed between the plurality of light emitting units.

The plurality of light emitting units may each include one subpixel, one pixel configured of a plurality of subpixels, or a plurality of pixels, and the common wiring electrode may be provided singly or in plural in each of the plurality of light emitting units.

In the plurality of light emitting units, respectively, the common wiring electrode may be formed on the same layer as the pixel electrode, being spaced apart from the pixel electrode, and the common electrode may be electrically connected to the common wiring electrode.

The common wiring electrode may be separated from the pixel electrode by a pixel defining layer.

The light emitting unit may further include an emission layer on the pixel electrode, and the emission layer may be on an upper surface of the pixel electrode and over a portion of the common wiring electrode.

The light emitting unit may further include an emission layer on the pixel electrode, and the common wiring electrode may be insulated from the pixel electrode by an insulating layer.

The insulating layer may be an inorganic insulating layer and may be formed earlier than the emission layer or formed after the emission layer is formed.

The insulating layer may be on a portion of an edge of the common wiring electrode toward the pixel electrode and on a portion of an edge of the pixel electrode toward the common wiring electrode.

The insulating layer may be on the entire edge of the common wiring electrode and the entire edge of the pixel electrode.

The pixel electrode may be provided in plural in each of the plurality of light emitting units, respectively, and the insulating layer may be formed among all the pixel electrodes and among the pixel electrodes and the common wiring electrode.

The encapsulation may include a first inorganic layer covering an edge of the common electrode, a first organic layer contacting the first inorganic layer and covering the common electrode, and a second inorganic layer contacting the first inorganic layer and covering the first organic layer.

The encapsulation may be formed of a single layer made of an organic-inorganic composite material.

BRIEF DESCRIPTION OF THE DRAWINGS

Features will become apparent to those of skill in the art by describing in detail example embodiments with reference to the attached drawings in which.

DETAILED DESCRIPTION

Figure 1:
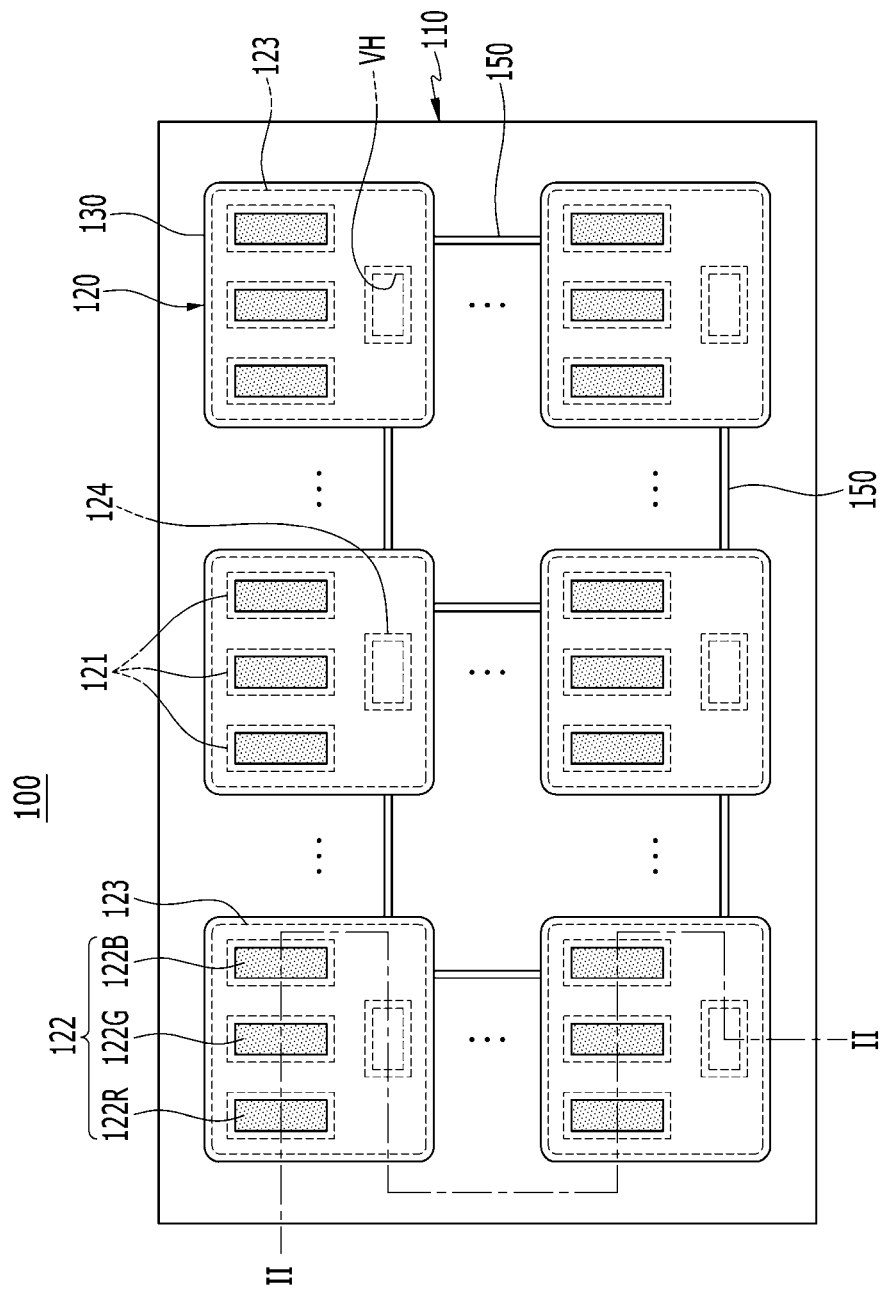
FIG. 1 illustrates a schematic diagram of a stretchable display device according to a first example embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

Throughout the present specification, it will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

In addition, unless explicitly described to the contrary, the word "comprise" and variations such as "comprises" or "comprising", will be understood to imply the inclusion of stated elements but not the exclusion of any other elements. The size and thickness of each configuration shown in the drawings are arbitrarily shown for understanding and ease of description, but the present disclosure is not limited thereto.

Figure 2A:
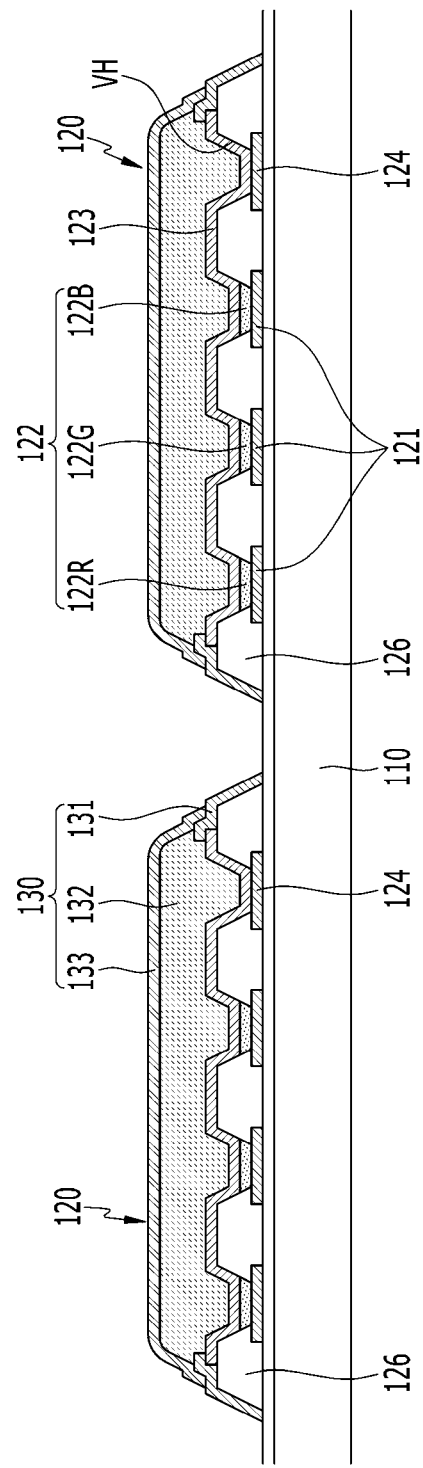
FIG. 2A illustrates a cross-sectional view of the stretchable display device taken along the line II-II' of FIG. 1.
Figure 3:
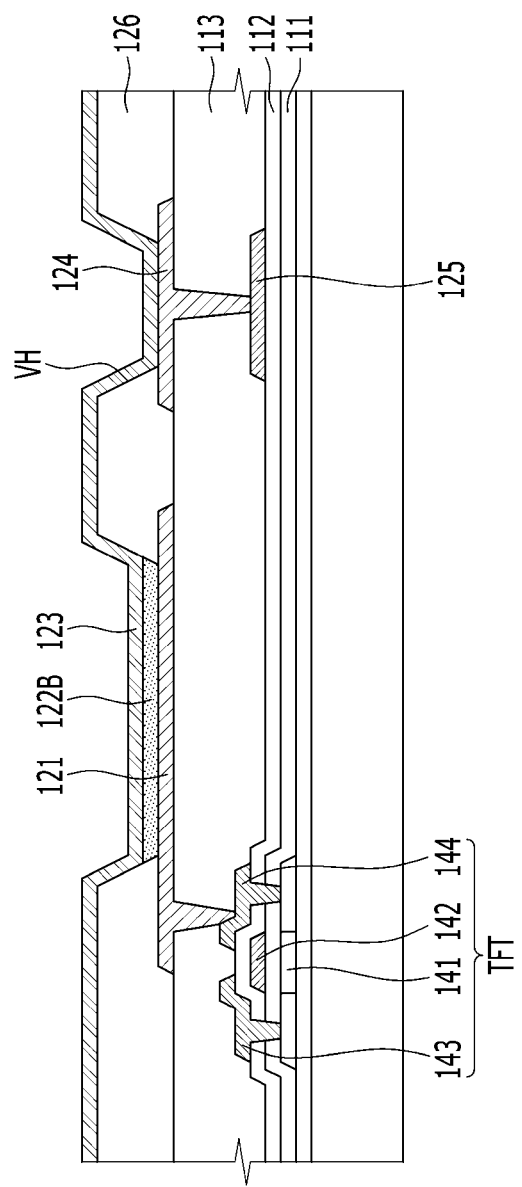
FIG. 3 illustrates a partial enlarged view of FIG. 2A.

FIG. 1 is a schematic diagram of a stretchable display device according to a first example embodiment, FIG. 2A is a cross-sectional view of the stretchable display device taken along the line II-IF of FIG. 1, and FIG. 3 is a partial enlarged view of FIG. 2A.

Referring to FIGS. 1, 2A, and 3, a display device 100 according to a first example embodiment includes a stretchable substrate 110, a plurality of light emitting units 120 formed on the stretchable substrate 110, and a plurality of encapsulations 130 covering and protecting a plurality of light emitting units 120, respectively.

The stretchable substrate 110 includes at least one portion forming a stretched area, in which the plurality of light emitting units 120 are formed on the stretched area. The stretched area may be stretched in at least one direction by an external force, and has a property of returning to an initial state when the external force is removed. The stretched area may be made of a polymer material having predetermined elasticity.

The plurality of light emitting units 120 configure a display unit, and the display unit has an increasing size as the stretched area is increased. The light emitting units 120 each include at least one pixel electrode 121, one common electrode 123, and at least one common wiring electrode 124. The light emitting unit 120 may include one subpixel, one pixel configured of a plurality of subpixels, and a plurality of pixels.

According to the first example embodiment, the light emitting unit 120 includes one pixel which includes a red subpixel, a green subpixel, and a blue subpixel. In this case, the light emitting unit 120 includes three pixel electrodes 121 each corresponding to three subpixels, three emission layers (red emission layer 122R, green emission layer 122G, and blue emission layer 122B) each formed on the three pixel electrodes 121, a common electrode 123 covering three emission layers 122R, 122G, and 122B, and a common wiring electrode 124 conducted by contacting the common electrode 123.

Each pixel electrode 121 is connected to a pixel circuit to receive an output current required for gray expression of the emission layer 122 from the pixel circuit. The pixel circuit includes at least two thin film transistors which include a switching thin film transistor and a driving thin film transistor and at least one capacitor including a storage capacitor at least one capacitor.

The driving thin film transistor (TFT) includes a semiconductor layer 141 which includes a channel region, a source region, and a drain region, a gate electrode 142 overlapping the channel region, and a source electrode 143 and a drain electrode 144 which are connected to the source region and the drain region, respectively. The semiconductor layer 141 and the gate electrode 142 are insulated from each other by a gate insulating layer 111 and the source electrode 143 and the drain electrode 144 are formed on an interlayer insulating layer 112.

The driving thin film transistor (TFT) is covered with a planarization layer 113 and the pixel electrode 121 is connected to the drain electrode 144 of the driving thin film transistor (TFT) through a via hole which is formed on the planarization layer 113. For convenience, FIG. 3 illustrates one driving thin film transistor The pixel circuit may further include a separate thin film transistor and a separate capacitor, if desired.

The pixel circuit is connected to a plurality of signal lines (not illustrated). The plurality of signal lines include scan lines through which scan signals are transferred, data lines through which data signals are transferred, and driving voltage lines through which a driving voltage is transferred. The switching thin film transistor may be connected to the scan line and the data line and the driving thin film transistor (TFT) may be connected to the driving voltage line and the pixel electrode 121.

The common electrode 123 covers all of the three emission layers 122R, 122G, and 122B and the common wiring electrode 124 is electrically connected to the common electrode 123 to apply a common voltage to the common electrode 123. The common wiring electrode 124 may be made of the same material as the pixel electrode 121 and may be formed on the planarization layer 113. The common wiring electrode 124 is provided singly or in plural in each light emitting unit 120. Further, the plurality of common wiring electrodes 124 is connected to a power supplier (not illustrated) outside the display unit through the common wiring 125 over the whole of the display unit The common wiring 125 may be formed on the same layer as the source/drain electrodes 143 and 144 or the gate electrode 142. FIG. 3 illustrates, for example, a case in which the common wiring 125 is formed on the same layer as the source/drain electrodes 143 and 144.

Any one of the pixel electrode 121 and the common electrode 123 serves as an anode which injects holes into the emission layer 122, and the other thereof serves as a cathode which injects electrons into the emission layer 122.

The emission layer 122 includes an organic emission layer and includes at least one of a hole injection layer, a hole transportation layer, an electron transportation layer, and an electron injection layer. The electrons and the holes are combined in the organic emission layer to generate excitons and light is emitted by energy generated when the excitons drops from an excited state to a ground state.

The pixel electrode 121 may be formed of a reflective layer and the common electrode 123 may be formed of a transparent layer or a transflective layer. In this case, light emitted from the emission layer 122 is reflected from the pixel electrode 121 and transmits through the common electrode 123 to be emitted to the outside. On the other hand, the pixel electrode 121 may be formed of the transparent or the transflective layer and the common electrode 123 may be formed of the reflective layer. In this case, the light emitted from the emission layer 122 is reflected from the common electrode 123 and transmits through the pixel electrode 121 and the stretchable substrate 110 to be emitted to the outside.

The reflecting layer may include Au, Ag, Mg, Al, Pt, Pd, Ni, Nd, Ir, Cr, and the like. The transparent layer may include indium tin oxide (ITO), indium zinc oxide (IZO), zinc oxide (ZnO), indium oxide ($In_2O_3$), and the like. The transflective layer may be formed of a metal thin film including Li, Ca, LiF/Ca, LiF/Al, Al, Ag, Mg, and the like and the transparent layer of ITO, IZO, ZnO, $In_2O_3$, and the like may be formed on the translucent layer.

Each light emitting unit 120 is encapsulated with an encapsulation 130. The emission layer 122 including the organic emission layer is very vulnerable to external humidity and oxygen and therefore the encapsulation 130 covers the light emitting unit 120 to prevent external air from penetrating. The encapsulation 130 may be formed of a multilayer including an organic layer of at least one layer and an inorganic layer of at least one layer or may be formed of a single layer of an organic-inorganic composite material in which an organic material and an inorganic material are mixed.

In a general organic light emitting device, the common electrode is formed of a single layer over the display unit and the encapsulation is formed over the display unit. However, the common electrode and the encapsulation may not flexibly cope with the case when the stretched substrate is stretched in at least one direction. Thus, the common electrode and the encapsulation formed over the whole of the display unit may be easily damaged when the stretched substrate is stretched.

The stretched display device 100 according to the first example embodiment includes the common electrode 123 and the encapsulation 130 which are separately formed for each light emitting unit 120 to minimize the damage of the common electrode 123 and the encapsulation 130 when the stretched substrate 110 is stretched in at least one direction. Thus, the common electrode 123 and the encapsulation 130 which are separately formed in plural in the display unit may flexibly cope with the stretching and restoring of the stretchable substrate 110.

In this case, electrodes which are positioned between the plurality of light emitting units 120 may have a property that they are stretched along with the stretched substrate 110. The stretchable electrode 150 may be made of a conductive polymer material having predetermined elasticity or may be made of a metal strip which is bent once or more, e.g., in a zig zag or planar coil, and the like. FIG. 1 schematically illustrates that for convenience, a string of stretchable electrodes 150 are positioned between the light emitting units 120, but the stretchable electrode 150 may include a scan line, a data line, a driving voltage line, a common wiring, and the like.

Each light emitting unit 120 includes a pixel defining layer (or barrier rib) 126. The pixel defining layer 126 covers edges of the pixel electrodes 121 and an edge of the common wiring electrode 124 and exposes a central portion of the pixel electrode 121 in which the emission layer 122 will be formed. Further, the pixel defining layer 126 forms a via hole VH on the common wiring electrode 124 to expose a portion of the common wiring electrode 124 which the common electrode 123 will contact.

The common wiring electrode 124 is separated from adjacent pixel electrodes 121 by the pixel defining layer 126, and therefore a separate insulating structure for insulating the common wiring electrode 124 from the pixel electrode 121 need not be provided within the light emitting unit 120.

As such, the light emitting unit 120 includes the common wiring electrode 124 and the common electrode 123 is electrically connected to the common wiring electrode 124 through the via hole VH. Thus, even though the common electrode 123 is separated in plural corresponding to each light emitting unit 120, the common electrodes 123 that are provided in the display unit may be applied with the same common voltage.

The encapsulation 130 may be formed of a multilayer including an organic layer and an inorganic layer as described above, or may be formed of a single layer of an organic-inorganic composite material. For example, as illustrated in FIG. 2A, the encapsulation 130 may include a first inorganic layer 131 covering the edge of the common electrode 123, a first organic layer 132 covering the common electrode 123, and a second inorganic layer 133 covering the first organic layer 132. In this case, the first organic layer 132 and the second inorganic layer 133 each contact the first inorganic layer 131.

The first inorganic layer 131 is formed on the pixel defining layer 126 and may include aluminum oxide (AlOx). The first inorganic layer 131 covers the edge of the common electrode 123 to prevent the edge of the common electrode 123 from being exposed. The first inorganic layer 131 may be formed in a predetermined width on the edge of the common electrode 123 or cover the whole of the common electrode 123. In the latter case, the first inorganic layer 131 is formed to be larger than the common electrode 123.

The first organic layer 132 contacts the first inorganic layer 131 and covers the common electrode 123. An edge of the first organic layer 132 is positioned inside an edge of the first inorganic layer 131. The first organic layer 132 may include epoxy, acrylate, urethane acrylate, and the like.

The second inorganic layer 133 contacts the first inorganic layer 131 and covers the first organic layer 132. The second inorganic layer 133 is formed to be larger than the first organic layer 132 to prevent the first organic layer 132 from being exposed to the outside. The second inorganic layer 133 may include silicon nitride (SiNx) or aluminum oxide (AlOx).

The first and second inorganic layers 131 and 133 serve to block moisture and oxygen from penetrating from the outside. The first organic layer 132 mitigates stress of the first and second inorganic layers 131 and 133 and serves to fill micro cracks, pin holes, and the like of the first inorganic layer 131. If the organic material is exposed to the outside, the first organic layer 132 may serve as a transfer path of moisture and oxygen, and therefore the second inorganic layer 133 completely covers the first organic layer 132 to prevent the first organic layer 132 from being exposed to the outside.

Figure 2B:
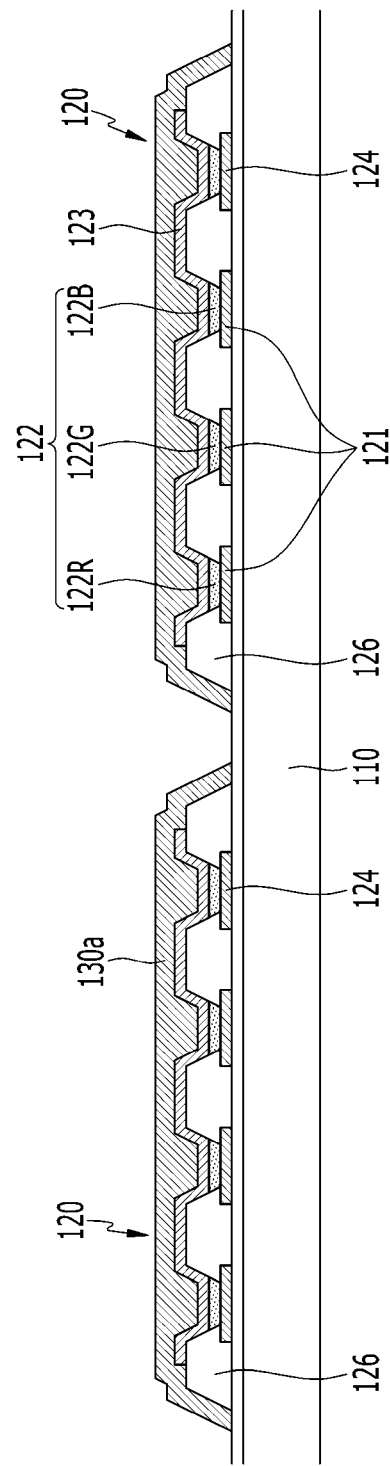
FIG. 2B illustrates a cross-sectional view of the stretchable display device illustrating an exemplary variation of the encapsulation shown in FIG. 2A.

The organic-inorganic composite material may simultaneously implement a flexible property of the organic material, and a moisture and oxygen blocking property (encapsulation property) of the inorganic material, and therefore may exhibit sufficient encapsulation performance only by the single layer. FIG. 2B illustrates a cross-sectional view of the stretchable display device illustrating an exemplary variation of the encapsulation shown in FIG. 2A. As illustrated in FIG. 2B, the encapsulation 130a configured of the single layer of the organic-inorganic composite material also covers the edge of the common electrode 123 and may be formed to be larger than the common electrode 123.

The encapsulation 130, 130a may be formed to protrude upward, formed flatly, or formed to be depressed downward. FIG. 2A and FIG. 2B illustrate, for example, a case in which the encapsulation 130, 130a has a flat upper surface.

Figure 4:
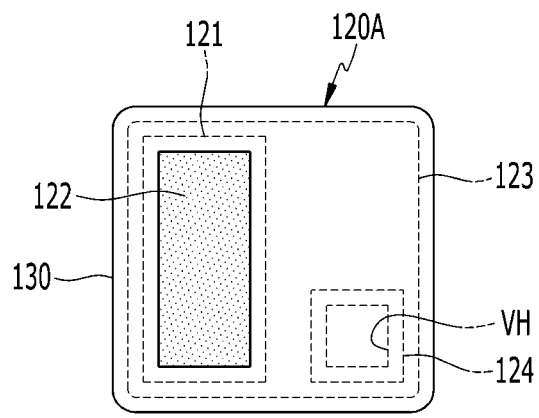
FIG. 4 illustrates a plan view schematically illustrating one light emitting unit in a stretchable display device according to a second example embodiment.

FIG. 4 is a plan view schematically illustrating one light emitting unit in a stretchable display device according to a second example embodiment.

Referring to FIG. 4, a light emitting unit 120A in the stretchable display device according to a second example embodiment includes one subpixel. The light emitting unit 120A includes one pixel electrode 121, one emission layer 122 formed on the pixel electrode 121, at least one common wiring electrode 124 adjacent to the pixel electrode 121, and the common electrode 123 covering the emission layer 122, and the at least one common wiring electrode 124.

The emission layer 122 is any one of the red emission layer, the green emission layer, and the blue emission layer, and the common electrode 123 is electrically connected to the common wiring electrode 124 via the via hole VH of the pixel defining layer to be applied with the common voltage. FIG. 4 illustrates, for example, one common wiring electrode 124 but the number of common wiring electrodes 124 is not limited to the illustrated example.

A size of the light emitting unit 120A including one subpixel is about ⅓ smaller than that of the light emitting unit 120 according to the first example embodiment. Therefore, the stretchable display device according to the second example embodiment may minimize the size of the light emitting unit 120A without stretchability in the entire display unit, and as a result, may be more flexibly stretched than the stretchable display device according to the first example embodiment as described above.

The stretchable display device according to the second example embodiment has the same configuration as the stretchable display device according to the first example embodiment, except that the light emitting unit 120A includes one subpixel.

Figure 5:
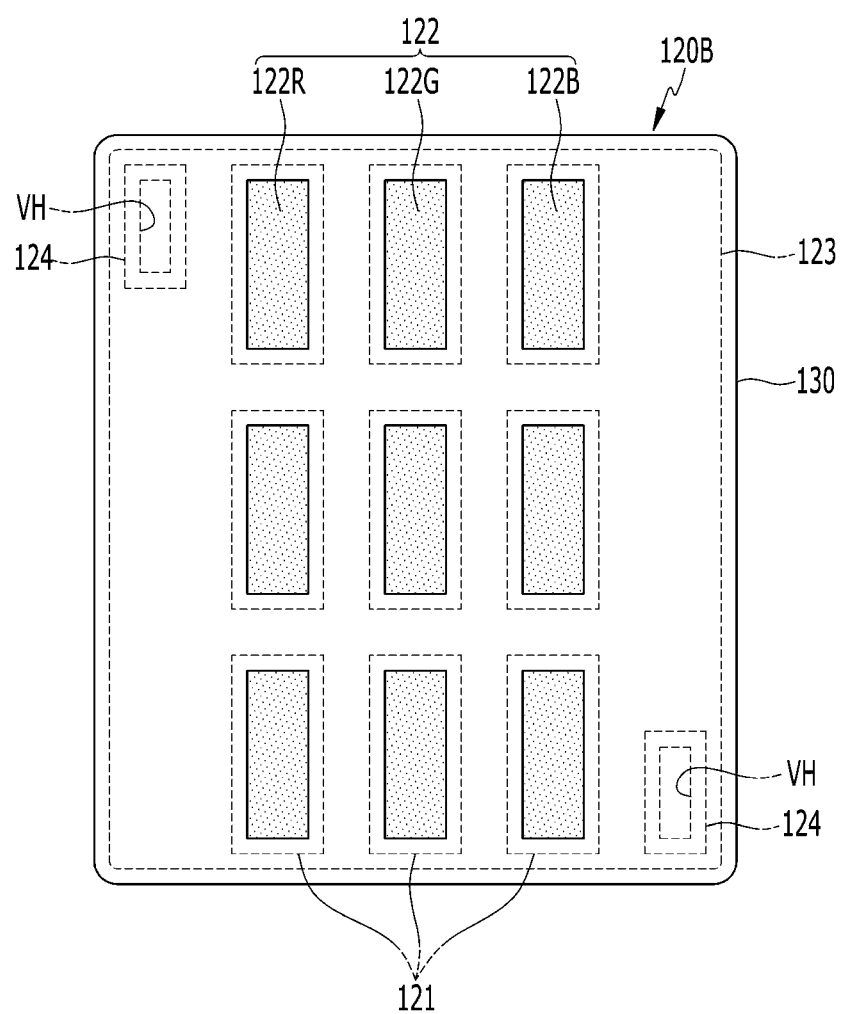
FIG. 5 illustrates a plan view schematically illustrating one light emitting unit in a stretchable display device according to a third example embodiment.

FIG. 5 is a plan view schematically illustrating one light emitting unit in a stretchable display device according to a third example embodiment.

Referring to FIG. 5, a light emitting unit 120B in the stretchable display device according to a third example embodiment includes a plurality of pixels. The light emitting unit 120B includes at least four pixel electrodes 121, at least four emission layers 122 each formed on the at least four pixel electrodes 121, at least one common wiring electrode 124, and the common electrode 123 covering the at least four emission layers 122 and the at least one common wiring electrode 124.

The plurality of emission layers 122 are any one of the red emission layer 122R, the green emission layer 122G, and the blue emission layer 122B and the common electrode 123 is electrically connected to the common wiring electrode 124 via the via hole VI-I of the pixel defining layer to be applied with the common voltage. The two common wiring electrodes 124 may be separately formed at one side and the other side of the pixel electrodes 121 and in this case, may minimize voltage drop due to the resistance of the common electrode 123.

FIG. 5 illustrates, for example, nine pixel electrodes 121 and two common wiring electrodes 124; however, the number of pixel electrodes 121 and the number of common wiring electrodes 124 are not limited to the illustrated example. The stretchable display device according to the third example embodiment has the same configuration as the stretchable display device according to the first example embodiment, except that the light emitting unit 120B includes a plurality of pixels.

Figure 6:
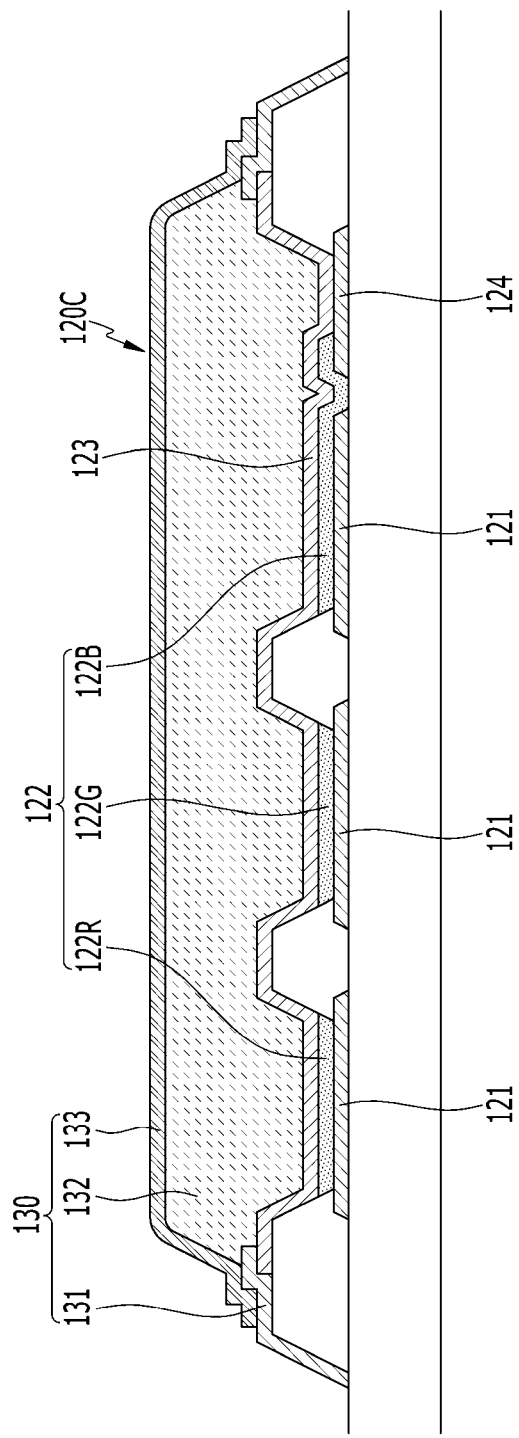
FIG. 6 illustrates a cross sectional view illustrating one light emitting unit in a stretchable display device according to a fourth example embodiment.

FIG. 6 is a cross sectional view illustrating one light emitting unit in a stretchable display device according to a fourth example embodiment.

Referring to FIG. 6, the pixel defining layer 126 is omitted between the common wiring electrode 124 and the adjacent pixel electrodes 121 in the stretchable display device according to the fourth example embodiment; the common wiring electrode 124 is insulated from the adjacent pixel electrode 121 by the emission layer 122B.

A light emitting unit 120C may include one subpixel, include one pixel, or include a plurality of pixels. FIG. 6 illustrates, for example, a case in which the light emitting unit 120C includes one pixel formed of three subpixels. In this case, the pixel defining layer 126 may be formed among three pixel electrodes 121 and may be formed on the edge of the common wiring electrode 124 which does not face the pixel electrode 121.

The emission layer 122B on the pixel electrodes 121 adjacent to the common wiring electrode 124 may be formed on the upper surface of the pixel electrode 121, between the pixel electrode 121 and the common wiring electrode 124, and on a portion of the upper surface of the common wiring electrode 124. The emission layer 122B emits light in an area overlapping the pixel electrode 121, and the rest area of the emission layer 122B which does not overlap the pixel electrode 121 serves as the insulating layer which insulates between the pixel electrode 121 and the common wiring electrode 124.

The stretchable display device according to the fourth example embodiment has the same configuration as any one of the first to third example embodiments as described above, except that the pixel defining layer 126 is omitted between the common wiring electrode 124 and the adjacent pixel electrodes 121 and the emission layer 122B extends to the common wiring electrode 124 to insulate between the common wiring electrode 124 and the pixel electrode 121

Figure 7:
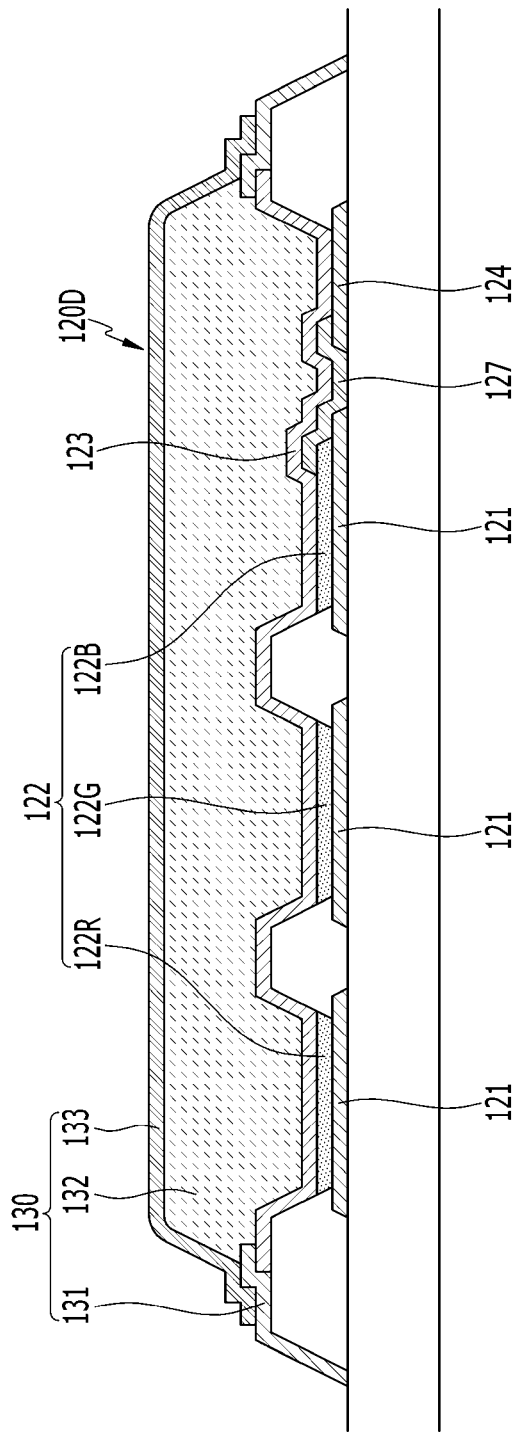
FIG. 7 illustrates a cross sectional view illustrating one light emitting unit in a stretchable display device according to a fifth example embodiment.

FIG. 7 is a cross sectional view illustrating one light emitting unit in a stretchable display device according to a fifth example embodiment.

Referring to FIG. 7, in the stretchable display device according to the fifth example embodiment, the common wiring electrode 124 is insulated from the adjacent pixel electrodes 121 by an insulating layer 127. The insulating layer 127 may be an inorganic insulating layer such as silicon nitride (SiNx), silicon oxide (SiO₂), and the like, and may be formed by deposition and patterning (for example, dry etching, and the like) processes after the emission layer 122 is formed.

The insulating layer 127 may be formed on a portion of the upper surface of the emission layer 122B, between the pixel electrode 121 and the common wiring electrode 124, and on a portion of the upper surface of the common wiring electrode 124. The insulating layer 127 is formed and then the common electrode 123 is formed and the common electrode 123 is electrically connected to the common wiring electrode 124 to be applied with the common voltage.

The stretchable display device according to the fifth example embodiment has the same configuration as the fourth example embodiment as described above, except that instead of the emission layer 122, the insulating layer 127 is used to insulate between the common wiring electrode 124 and the adjacent pixel electrodes 121. FIG. 7 illustrates that reference numeral 120D represents the light emitting unit.

Figure 8:
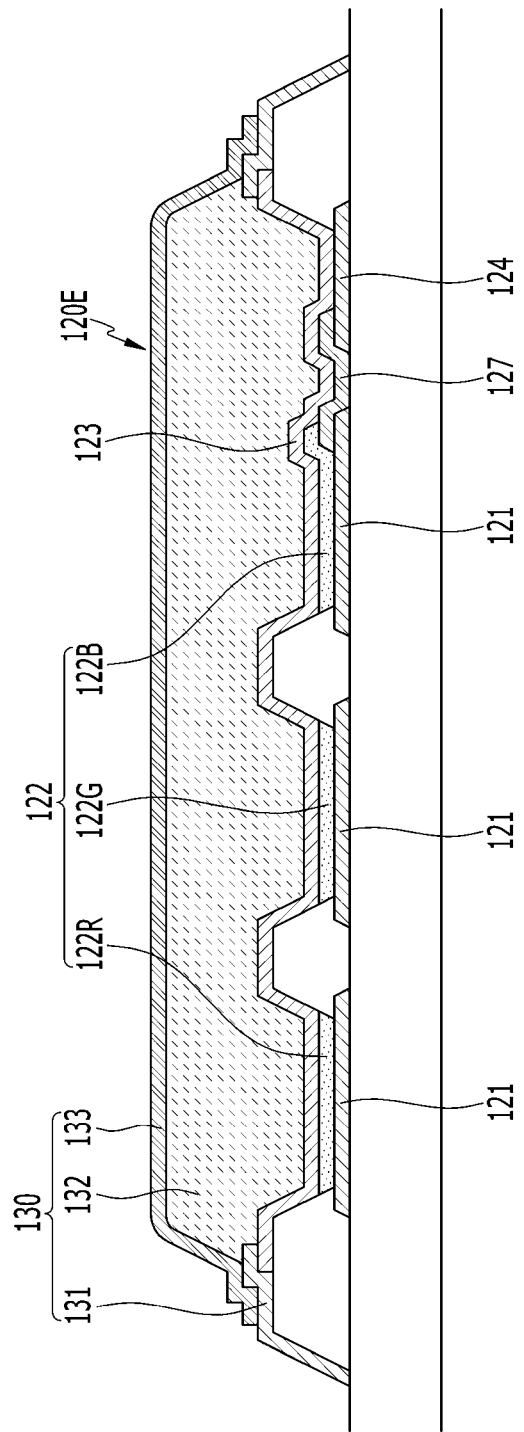
FIG. 8 illustrates a cross sectional view illustrating one light emitting unit in a stretchable display device according to a sixth example embodiment.

FIG. 8 is a cross sectional view illustrating one light emitting unit in a stretchable display device according to a sixth example embodiment.

Referring to FIG. 8, in the stretchable display device according to the sixth example embodiment, the common wiring electrode 124 is insulated from the adjacent pixel electrodes 121 by the insulating layer 127. The insulating layer 127 may be an inorganic insulating layer such as silicon nitride (SiNx), silicon oxide (SiO$_2$), and the like, and may be formed by deposition and patterning (for example, dry etching, and the like) processes before the emission layer 122 is formed.

The insulating layer 127 may be formed on a portion of the upper surface of the pixel electrode 121, between the pixel electrode 121 and the common wiring electrode 124, and on a portion of the upper surface of the common wiring electrode 124. The insulating layer 127 is formed and then the emission layer 122 and common electrode 123 are formed and the common electrode 123 is electrically connected to the common wiring electrode 124 to be applied with the common voltage.

According to the fifth example embodiment and the sixth example embodiment, the common electrode 123 has a step due to the thickness of the insulating layer 127. In the case of the large step, the common electrode 123 may be disconnected. Therefore, the insulating layer 127 may be formed to have a small thickness and may have an inclined side to prevent the common electrode 123 from being disconnected on the insulating layer 127.

The stretchable display device according to the sixth example embodiment has the same configuration as the fifth example embodiment as described above, except that the insulating layer 127 is formed before the emission layer 122 is formed. FIG. 8 illustrates that reference numeral 120E represents the light emitting unit.

Figure 9:
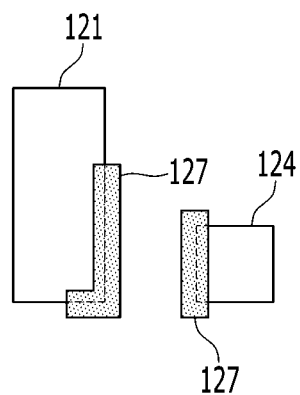
FIGS. 9 to 11 illustrate partial plan views illustrating a modified example of an insulating layer in the stretchable display device of the fifth example embodiment and the sixth example embodiment.
Figure 10:
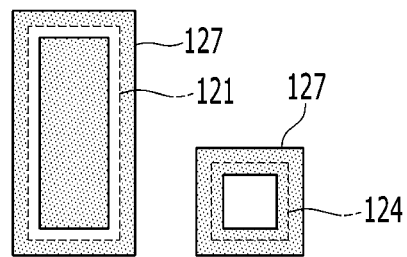
Figure 11:
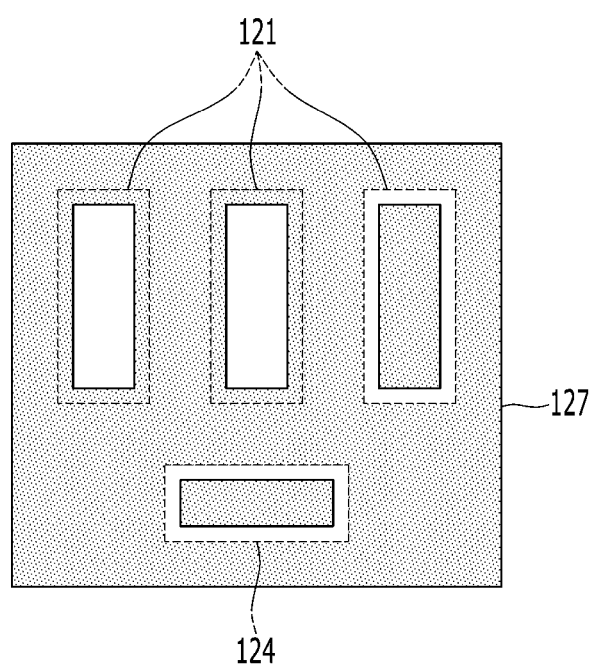

FIGS. 9 to 11 are partial plan views illustrating a modified example of an insulating layer in the stretchable display device of the fifth example embodiment and the sixth example embodiment.

Referring to FIG. 9, the insulating layer 127 may be on a portion of the edge of the common wiring electrode 124 toward the pixel electrode 121 and on a portion of the edge of the pixel electrode 121 toward the common wiring electrode 124. Referring to FIG. 10, the insulating layer 127 may be formed on the entire edge of the common wiring electrode 124 and formed on the entire edge of the pixel electrodes 121 adjacent to the common wiring electrode 124.

The planarization layer 113 (see FIG. 3) is positioned between the pixel electrode 121 and the common wiring electrode 124, and therefore the insulating layer 127 may not be completely filled between the pixel electrode 121 and the common wiring electrode 124.

Referring to FIG. 11, the insulating layer 127 may be formed between the pixel electrodes 121, and may be formed between the pixel electrodes 121 and the common wiring electrode 124. In this case, the insulating layer 127 may cover the edge of the pixel electrodes 121 and the edge of the common wiring electrode 124. The pixel defining layer (not illustrated) may be formed between the pixel electrodes 121 on the insulating layer 127.

By way of summation and review, among the changeable display devices, there is a stretchable display device which may be stretched in at least one direction. The stretchable display device includes a stretchable substrate, at least a portion is stretched, with a plurality of pixels formed on the stretchable substrate. The plurality of pixels should not hinder the stretching of the stretchable substrate and should not be damaged while the stretchable substrate is stretched and then restored.

As described above, embodiments relate to a stretchable display device which may be stretched in at least one direction. Embodiments may provide a stretchable display device capable of having an improved pixel structure, flexibly coping with stretching and restoring of a stretchable substrate. According to embodiments, the stretchable display device includes the common electrode and the encapsulation which are separately formed in each light emitting unit, such that the damage of the common electrode and the encapsulation may be minimized when the stretchable substrate is stretched in at least one direction. Further, the common electrode and the encapsulation which are separately formed in plural in the display unit may flexibly cope with the stretching and restoring of the stretchable substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a substrate having a first main surface, a second main surface opposed to the first main surface, and a side surface connecting the first main surface to the second main surface, the side surface having a smaller surface area than the first main surface;
   a plurality of light emitting units, each light emitting unit having an island shape on the substrate and including at least one subpixel, each subpixel including a pixel electrode, an emission layer and a common electrode; and
   a set of encapsulations separately covering each of the plurality of light emitting units, wherein
   each set of encapsulations includes a first inorganic layer, a first organic layer, and a second inorganic layer, and
   a region of the first organic layer does not overlap the first inorganic layer in a thickness direction, the thickness direction being a direction perpendicular to the first main surface of the substrate.

2. The display device as claimed in claim 1, wherein, the first inorganic layer and the second inorganic layer are in direct contact with each other at an edge of encapsulation,
   each light emitting unit include a pixel defining layer,
   the first inorganic layer is in direct contact with a side surface of the pixel defining layer, and
   the pixel defining layer overlaps the first inorganic layer, the first organic layer, and the second inorganic layer.

3. The display device as claimed in claim 1, wherein, each set of encapsulations for any light emitting unit makes no direct contact with any encapsulation layer for any neighboring light emitting unit.

4. The display device as claimed in claim 1, further comprising an electrode disposed between the plurality of light emitting units.

5. The display device as claimed in claim 4, wherein:
   each set of encapsulations is separately disposed on each light emitting unit, each subpixel includes the pixel electrode, the emission layer, and the common electrode connecting another subpixel, and
   each light emitting unit includes at least one common wiring electrode connected to the common electrode.

6. The display device as claimed in claim 5, wherein, in each respective light emitting unit of the plurality of light emitting units:
the common wiring electrode is on the same layer as the pixel electrode, being spaced apart from the pixel electrode, and
the common electrode is electrically connected to the common wiring electrode.

7. The display device as claimed in claim 6 wherein the common wiring electrode is separated from the pixel electrode by the pixel defining layer.

8. The display device as claimed in claim 6, wherein the emission layer is on the pixel electrode and over a portion of the common wiring electrode.

9. The display device as claimed in claim 6, wherein the common wiring electrode is insulated from the pixel electrode by an insulating layer.

10. The display device as claimed in claim 9, wherein the insulating layer is an inorganic insulating layer.

11. The display device as claimed in claim 9, wherein the insulating layer is on a portion of an edge of the common wiring electrode and on a portion of an edge of the pixel electrode.

12. The display device as claimed in claim 9, wherein the insulating layer is on all edges of the common wiring electrode and all edges of the pixel electrode.

13. The display device as claimed in claim 9, wherein:
the pixel electrode is provided in plural in each of the plurality of light emitting units, respectively, and
the insulating layer is on every space between the pixel electrodes and between the pixel electrodes and the common wiring electrode.

14. The display device as claimed in claim 5, wherein
the first inorganic layer covers an edge of the common electrode,
the first organic layer contacts the first inorganic layer and covers the common electrode, and
the second inorganic layer contacts the first inorganic layer and covers the first organic layer.

15. The display device as claimed in claim 1, wherein the first inorganic layer makes direct contact with the substrate.

16. The display device as claimed in claim 1, wherein each respective set of encapsulations makes direct contact with only one light emitting unit and the substrate.

17. The display device as claimed in claim 16, wherein the display device includes no encapsulation layer that makes direct contact with the substrate and makes direct contact with any two neighboring light emitting units.

18. The display device as claimed in claim 1, wherein the first organic layer is between the first inorganic layer and the second inorganic layer in the thickness direction for each set of encapsulations.

19. The display device as claimed in claim 1, wherein a region of the second inorganic layer does not overlap the first inorganic layer in the thickness direction.

* * * * *